US010049779B1

(12) United States Patent
Ayers

(10) Patent No.: US 10,049,779 B1
(45) Date of Patent: Aug. 14, 2018

(54) METHOD AND APPARATUS FOR A RADIOISOTOPE POWERED ELECTROMAGNETIC SIGNAL GENERATOR AND TRANSMITTER

(71) Applicant: Ayers Group, LLC, Princeton, NJ (US)

(72) Inventor: William M. Ayers, Princeton, NJ (US)

(73) Assignee: Ayers Group, LLC, Princeton, NJ (US)

( * ) Notice: Subject to any disclaimer, the term of this patent is extended or adjusted under 35 U.S.C. 154(b) by 545 days.

(21) Appl. No.: 14/658,693

(22) Filed: Mar. 16, 2015

Related U.S. Application Data

(60) Provisional application No. 61/953,276, filed on Mar. 14, 2014.

(51) Int. Cl.
| | |
|---|---|
| *G21K 1/093* | (2006.01) |
| *H01J 25/587* | (2006.01) |
| *H03B 9/10* | (2006.01) |
| *H03L 7/26* | (2006.01) |
| *G21H 1/02* | (2006.01) |

(52) U.S. Cl.
CPC ............... *G21H 1/02* (2013.01); *G21K 1/093* (2013.01); *H01J 25/587* (2013.01); *H03B 9/10* (2013.01); *H03L 7/26* (2013.01)

(58) Field of Classification Search
CPC .......... G21K 1/093; H01J 23/20; H01J 25/02; H01J 25/025; H01J 25/04; H01J 25/10–25/20; H01J 25/50; H01J 25/52; H01J 25/58; H01J 25/587; H01J 25/593; H03B 9/00; H03B 9/01; H03B 9/02; H03B 9/04; H03B 9/06; H03B 9/08; H03B 9/10; H03L 7/26
USPC ................................................ 331/83, 86–91
See application file for complete search history.

(56) References Cited

U.S. PATENT DOCUMENTS

| | | | | |
|---|---|---|---|---|
| 3,305,753 A | * | 2/1967 | White ................... | H01J 25/587 313/157 |
| 4,835,433 A | * | 5/1989 | Brown ................... | G21H 1/04 136/202 |
| 8,153,997 B2 | * | 4/2012 | Norling ................ | H05H 13/00 250/396 ML |
| 2010/0062288 A1 | * | 3/2010 | Weber ................... | H01J 23/05 429/10 |
| 2011/0266455 A1 | * | 11/2011 | Balakin ................ | G21K 1/087 250/396 ML |

* cited by examiner

*Primary Examiner* — Levi Gannon
(74) *Attorney, Agent, or Firm* — Woodard, Emhardt, Moriarty, McNett & Henry, LLP

(57) ABSTRACT

An internally powered electromagnetic signal transmitter is described in which defined magnetic fields direct beta radioisotope electrons to induce gigahertz oscillations in resonant cavities. The device resonant cavities can be fabricated from light weight metalized plastic materials to greatly decrease its weight compared to conventional gigahertz sources. The transmitter output power, frequencies, and longevity are a function of the magnetic field strength, radioisotope quantity, half-life, and decay energy. Embodiments of the disclosed devices can transmit frequencies in the S and Ka bands.

31 Claims, 4 Drawing Sheets

US 10,049,779 B1

METHOD AND APPARATUS FOR A RADIOISOTOPE POWERED ELECTROMAGNETIC SIGNAL GENERATOR AND TRANSMITTER

REFERENCE TO RELATED APPLICATION

This application claims the benefit of U.S. Provisional Application No. 61/953,276, filed Mar. 14, 2014, which is hereby incorporated by reference in its entirety.

FIELD

In certain aspects, the present invention relates generally to high frequency transmitters and in particular to resonant cavity based high frequency transmitters.

BACKGROUND

Many applications such as satellites and light weight robotic aircraft require high frequency electromagnetic transmitters with minimal power requirements. Such transmitters are also utilized to monitor tanks which store radioisotopes, such as Krypton-i5. Powering such transmitters with light weight, long-lifetime sources rather than batters is also advantageous in decreasing weight and system longevity. In U.S. Pat. No. 2,926,268, which is herein incorporated by reference in its entirety, Reymond describes the use of beta electrons emitted from a radioisotope to decrease the power requirements of conventional vacuum diodes. However, that patent does not utilize magnetic fields and is limited to direct current applications that require an external power supply. Southwirth ("Principles and Application of Waveguide Transmission," G. Southworth, Van Nostrand (1950), herein incorporated by reference in its entirety) and Harmon ("Fundamentals of Electron Motion," W.H. Harman, McGraw-Hill (1953), herein incorporated by reference in its entirety, discuss the interaction of electron gun beams with magnetic fields such as in traveling wave tubes and other high frequency oscillators. In such devices high frequency power supplies couple energy into the electron beam through a series of resonant cavities thereby increasing the electron energy.

In aspects of the present disclosure, an inverse process is used such that high velocity beta electrons induce currents in resonant cavities to provide an output transmission signal. As described in detail below, the resonant coupling and induced signal generation is accomplished by altering the emitted beta electron trajectory with a homogenous magnetic field such that the electrons enter a cycloid or helical motion with an angular velocity. The electron trajectories induce oscillating currents in a novel resonant cavity structure fabricated from engineering plastic components (for example, metalized plastic) to generate and transmit the high frequency signals.

SUMMARY

According to one aspect of the present disclosure an electromagnetic transmitter is described in which a magnetic field directs radioisotope beta electrons to induce oscillations in resonant cavities. The transmitter is constructed with appropriate levels of beta radioisotope energy and magnet field strength along with selected resonant cavity values and device dimensions. The transmitter output power, frequencies, and longevity are a function of the magnetic field strength, radioisotope quantity, half-life, and decay energy. The invention can transmit frequencies including the S and Ka bands. Several advantages of certain embodiments of the invention over prior art include: (a) greatly reduced transmitter weight (b) transmitters that can operate up to the half-life of a replaceable radioisotope source, and (c) transmitters that can operate at extremely low temperatures.

DETAILED DESCRIPTION

Figure 1:
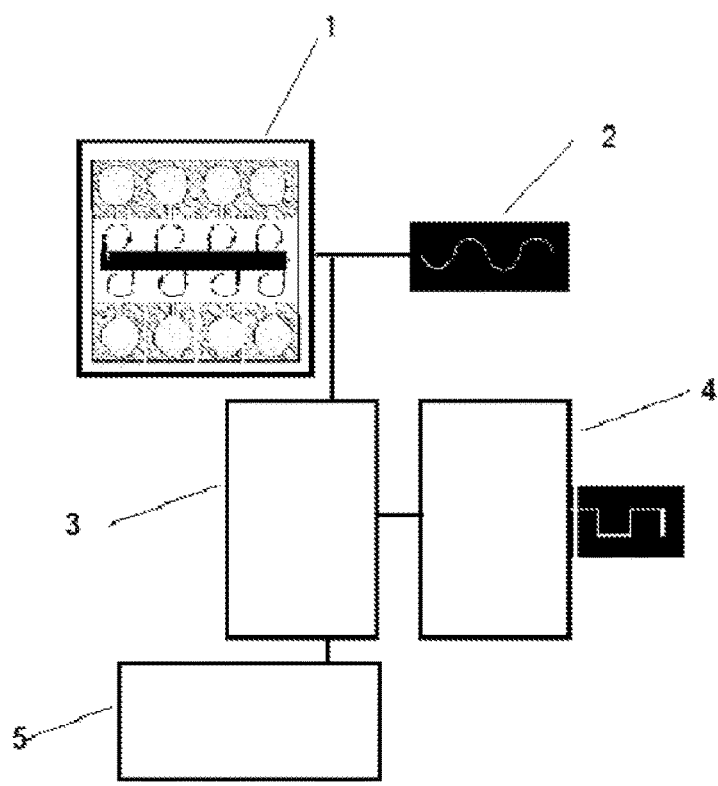
FIG. 1 is a schematic illustration of a transmitter according to one embodiment including its (1) resonant cavity containing the beta radioisotope, (2) high frequency and (4) pulsed photonic outputs, (3) high frequency rectifier and (5) signal processing electronics.

While the present invention may be embodied in many different forms, for the purpose of promoting an understanding of the principles of the present invention, reference will now be made to embodiments, some of which are illustrated in the drawings, and specific language will be used to describe the same. It will nevertheless be understood that no limitation of the scope of the invention is thereby intended. Any alterations and further modifications in the described embodiments and any further applications of the principles of the present invention as described herein are contemplated as would normally occur to one skilled in the art to which the invention relates.

Figure 2:
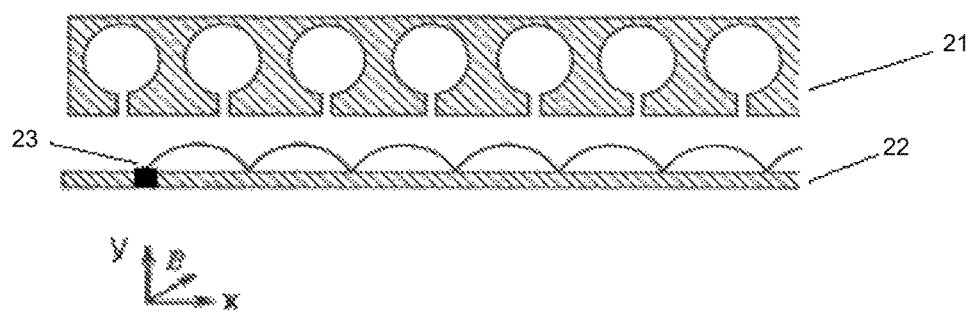
FIG. 2 depicts a cycloid beta electron trajectory in a linear resonant cavity transmitter for x-plane initial velocity component according to one embodiment.

There are several configurations for the transmitter device. One is the planar configuration illustrated in FIG. 2. With reference to FIG. 2, a series of inductor-capacitor resonant cavities 21 are spaced at a fixed distance above the bottom surface 22 containing a beta electron emitting radioisotope 23. The radioisotope may be deposited in a trench in the bottom surface to help collimate the emitted beam. The high velocity collimated beta electrons are emitted in the x-y plane perpendicular to a uniform magnetic field, B, oriented in the z direction of the illustration. Electrons with an initial velocity, Vyo, in the x-y plane are diverted by the Lorenz force into a cycloid trajectory as shown. Conservation of energy requires:

$$m\,V_{yo}^2 = m\,r^2\omega^3$$

Figure 6:
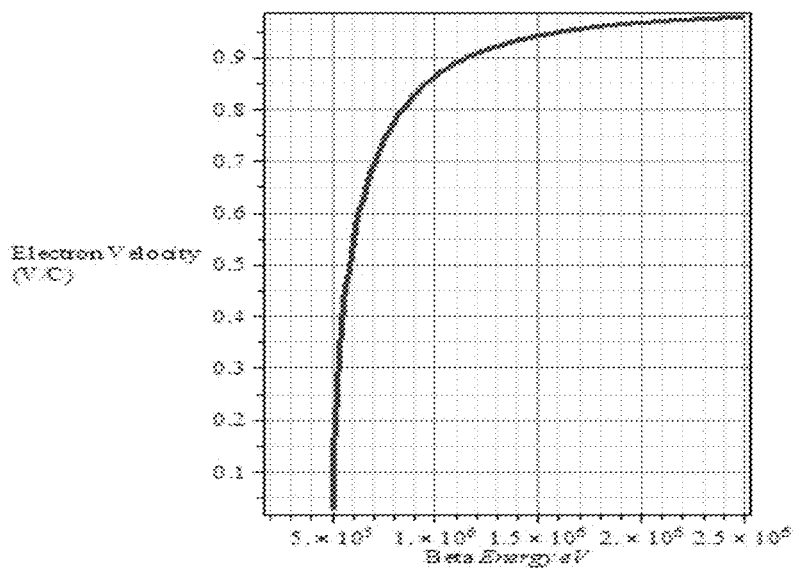
FIG. 6 depicts relativistic mass corrected initial beta electron velocity as a function of radioisotope decay energy (eV) according to one embodiment.

Such that the cycloid radius r is:

$r = Vyo(m/qB) = Vyo/\omega$

Where $\omega$ is the angular velocity (qB/m), m and q are the rest mass and charge of the electron respectively. The equations of motion for electrons in the x-y plane are:

$$(Vyo/Tau) - (qB/m)\frac{dx}{dt} = \frac{d^2y}{dt^2} \quad (2)$$

$$\left(\frac{qB}{m}\right)\frac{dy}{dt} = \frac{d^2x}{dt^2} \quad (3)$$

where Tau is the electron transit time, (Vyo/L), between the bottom plate and the resonant cavities separated by a distance, L. The relativistic mass corrected velocity, Vyo, as a function of the radioisotope decay energy is shown in FIG. 6.

Figure 3:
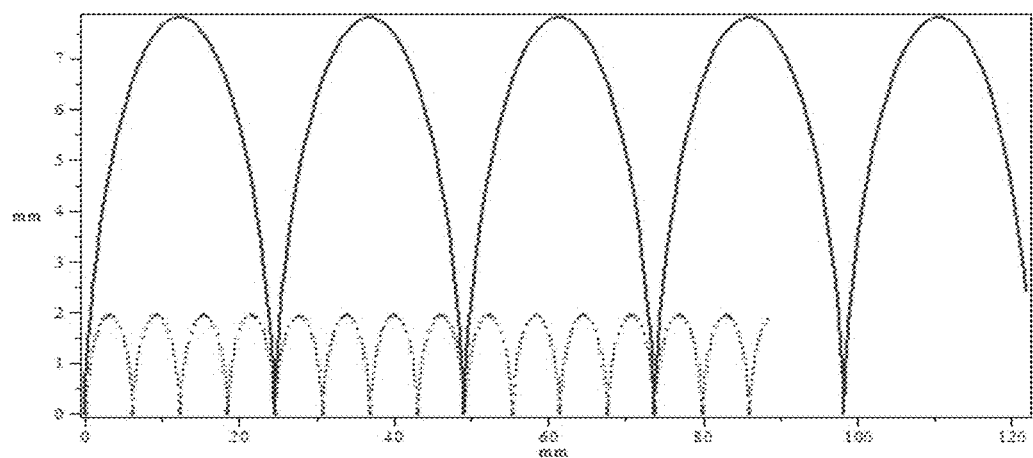
FIG. 3 depicts a cycloid beta electron trajectory in the x-y plane along a linear resonant cavity structure for a perpendicular magnetic field of 0.086 T and initial beta electron velocities of 20% (dotted line) and 40% (solid line) of the speed of light according to one embodiment.
Figure 4:
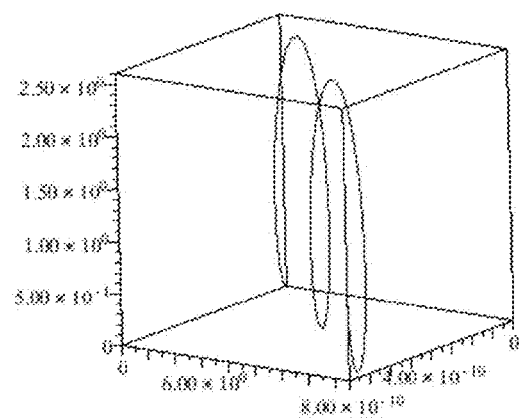
FIG. 4 depicts a time dependence of the cycloid trajectory shown in FIG. 3 according to one embodiment.

Substituting $$ka = \frac{q \cdot B}{m}$$

$$kb = (Vyo/Tau) = (Vyo^2/L)$$

into Eqs. (2) and (3) with the initial conditions, $dx/dt = Vxo = 0$ $dy/dt = Vyo$ provides the position of the electrons as a function of time:

$x(t) = [-(kb/ka)\sin(ka\ t) + kb\ t]/ka \quad (5)$ $y(t) = [(-kb/ka)\cos(ka\ t) + (kb/ka)]ka^2 \quad (6)$ This solution assumes charge neutrality is satisfied between the emitted electrons and the positive space charge on the beta emitter surface. FIG. 3 shows the cycloid electron motion in the x-y plane for a magnetic field of 0.iyT and Vyo of 20 percent of the speed of light, C (2.99×10^7 m/sec). The solid line in FIG. 3. illustrates the electron motion with Vyo equal to 0.4×C. FIG. 4 illustrates the time dependent cycloid trajectory of the electrons.

Figure 5:
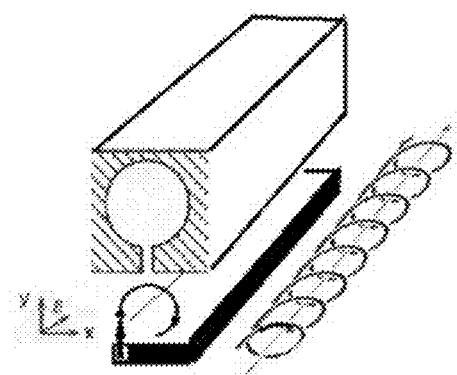
FIG. 5 depicts a helical trajectory for beta electrons emitted in the y-z plane for a homogenous magnetic field in the z direction according to one embodiment.

For beta electrons emitted with a velocity component parallel to the magnetic field (Z direction), the cycloid path is modified into a helical trajectory as shown in FIG. 5. In either case, the beta emission energy and hence the angular velocity and frequency are the same.

Both beta electron trajectories induce currents in the inductor-capacitor each time the electrons pass a cavity opening. The cavity inductance, L, and capacitance, C, values are chosen so that their resonant frequency is equal to the resonant angular frequency of the electrons. The electron angular frequency is:

$$\omega = \frac{qB}{m} \quad (7)$$

Matching that with the inductor-capacitor cavity resonant frequency defines the product of their values:

$$LC = \left(\frac{m}{qB}\right)^2 \quad (8)$$

The power output from the beta electron induced current in the resonant cavities is:

$P(t) = I(t)Ve(t)$ where $I(t) = Io\ \cos(\omega t + \Phi)$ and $Ve(t) = -\omega L\ Io\ \sin(\omega w + \Phi)$ where $\Phi$ is the phase angle between the current and voltage.

Therefore, for Nc cavities with $\Phi = 0$ at $t = 1/w$, the maximum power outut is:

$Pout = Nc\omega L\ Io^2(0.45) \quad (9)$

The power input to the device per gram of radioisotope is a function of its decay activity and energy:

$Pin = (Ao\ Ke)/Mw \quad (10)$

Where Ke is the beta electron kinetic energy (in Joules), Ao is the initial activity of the radioisotope in decay events per second per mole of material and Mw is the molecular weight of the isotope. Ao is defined from:

$Ao = No(\ln(2)/t_{1/2}) \quad (11)$

Where No is Avagardo's number and $t_{1/2}$ is the half-life. The total beta electron injection rate into the device is q Ao/Mw (amps/gm). Assuming a 100% power conversion efficiency, the input power equals the output power from the resonant LC cavities. Therefore, equating Eqs 9 and 10 yields:

$(Ao\ Ke/Mw) = Nc\omega L\ Io^2(0.455) \quad (12)$

Rearranging this equation with Eq. (8) for co provides the induced current, Io, in the resonant LC cavities.

$Io^2 = (Ao\ Ke/Mw\ Nc0.455)(L/\text{sqrt}(Lc)) \quad (13)$

Substituting Eq. 13 for Io in Eq 9 yields a maximum power output per gram of radioisotope of:

$Pout = Nc\ Io^2 0.455(L/\text{sqrt}(LC)) \quad (14)$

The power output from the resonant cavities is accessed through an antenna stub (which can be standard) or waveguide connected to the cavities. Hence, the device efficiency is decreased by the energy dissipated in the load resistance. The delivered output power, Pout, is $(Vrms)^2/R$ where Vrms is the mean square voltage across the load resistance.

Another factor in resonant cavity and LCR circuit design is the Q factor. As taught by Southworth, the Q factor shown in Eq. 15 defines the ratio of the energy stored per cycle in the circuit divided by the power dissipated in the circuit:

$Q = R^*\text{sqrt}(C//L) \quad (15)$

A well designed resonant cavity will have a Q equal to at least 10,000 and a shunt impedance R of about 1 Mohm. With these values, $(C/L) = (Q/R)^2 = 10^{-4} \quad (16)$ Therefore, this requirement along with Eq. 8 defines the design values for L and C. For a magnetic field of 0.086 T, $\omega$ is $1.5 \times 10^{10}$. Substituting these values in Eq. 8 provides the product of L and C:

$LC = 4.374 \times 10^{-21} \quad (17)$

Combining Eq. 16 and 17 yields:

$L^2 = (4.374 \times 10^{-21}/10^{-4})$ or L = 2.07 nH
and from Eq. 16, C = 0.2 pF.

The following example of the power output from a particular radioisotope will further clarify the transmitter simulation results.

Sulfur-35 is a pure beta emitting radioisotope. It has a molecular weight of 35 gm/mole, half-life of 87 days, average decay kinetic energy of 49 KeV (Vyo=0.46×C) and a specific activity of $1.62 \times 10^{15}$ beta emissions/sec-gram. With this data, the power into the device Pin is calculated from Eq. 10 as:

$$Pin = 12.7 \text{ watts/gram}$$

If the capacitance is set at 0.2 pF, and L is 2.07 nH, substituting these values into Eq. 13 yields an induced current, Io, of 527 mA per cycle for a Nc of one. This current produces an induced charge per cycle (Io/f) of about $2.2 \times 10^{-10}$ coulombs per cycle.

Figure 7:
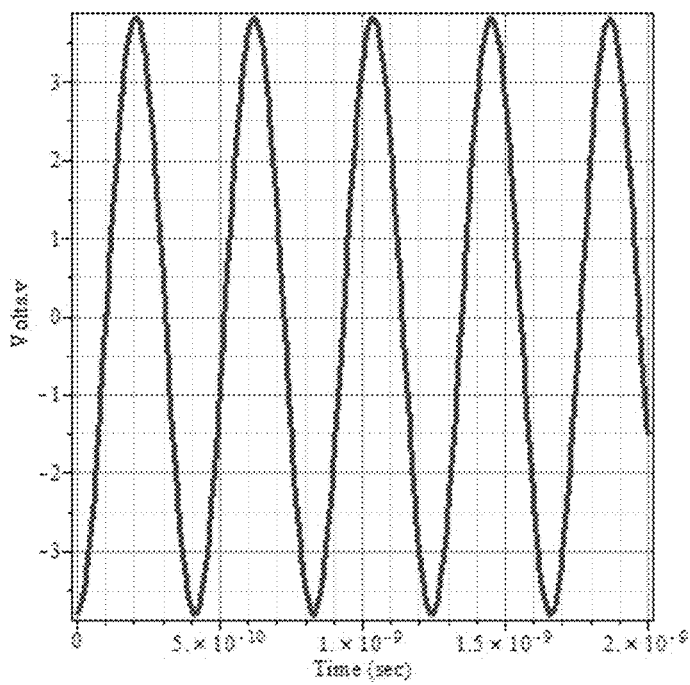
FIG. 7 depicts a resonant cavity output voltage for an initial beta electron induced charge of 0.18 nanocoulombs per cycle and a load resistance of 50 microohms (Me) according to one embodiment.
Figure 8:
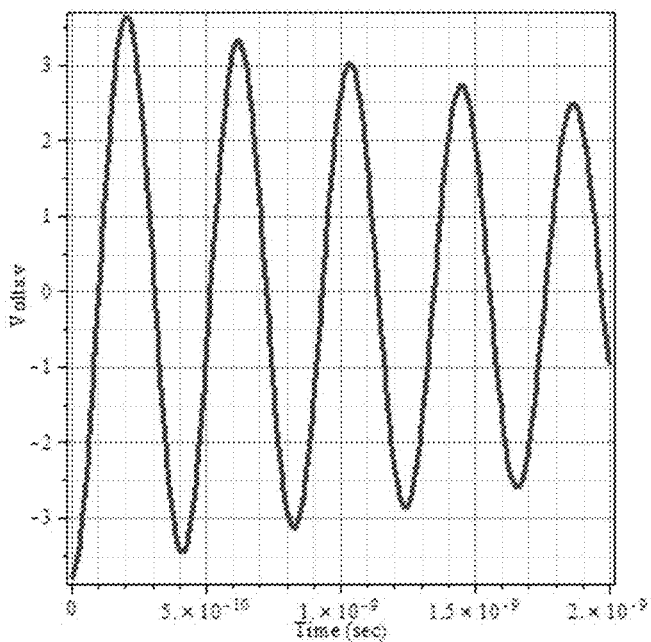
FIG. 8 depicts a resonant cavity output voltage for an initial beta electron induced charge of 0.18 nanocoulombs per cycle and load resistance of 50 ohms according to one embodiment.

FIG. 7 illustrates the parallel LCR equivalent circuit for a cavity voltage oscillation at near open circuit load of 50 Mohms. FIG. 8 illustrates the voltage decay through a 50 ohm load. If the device is built with 12 resonant cavities, the power output efficiency is about 28% of the input power.

With these simulation results and efficiency, 100 milligrams of S-35 (Pin=1.27 W) can initially generate a maximum of 0.356 W signal. Likewise for the same magnetic field, LC assumptions, and 28% efficiency, other beta radioisotopes and their initial power output (per 100 mg) are; P-33 (6.65 W) and Pm-147 (0.034 W).

These simulation results validate that electron trajectories necessary to induce currents in the resonant cavities are produced for specific electron velocity to magnetic field ratios. Choosing a particular radioisotope defines the half life, activity, and the emission energy which sets the initial velocity Vyo. Choosing the magnetic field then sets the trajectory radius and primary transmission frequency through the relationships:

$$f = (qB/m)/2\pi$$

and $$(Vyo/B) = (q\ m/r)$$

where the radius, r, applies to both cycloid and helical trajectories. The magnetic field also defines the resonant cavity inductance and capacitance values with Eq. 8. Equations 5 and 6 define the electron trajectory through the device and hence define its dimensions. Finally, the simulation demonstrates the transmitter power output functional dependence on the radioisotope activity, beta emission energy, and resonant cavity capacitance and inductance values.

Depending on the magnetic field, the primary transmitter frequency, ($\omega/2\pi$), can range from the S radar band (at B=0.08 T) to the Ka band (at B=1.2 T). However, as with other resonant cavity devices the frequency is broadened by inhomogeneities in the magnetic field across the device and variations in the electron initial velocity.

The initial power per gram of radioisotope from the transmitter will decrease over time based on the half-life of the radioisotope. By definition, the activity at the half life is:

$$A(t^{1/2}) = (No/2)(1n(2)/t_{1/2}) = Ao/2$$

Since the output power is proportional to the square of the induced current, and that is proportional to the activity, the power output will also be reduced by 50% at the half life.

Another preferred embodiment of the transmitter directs the high frequency output signal into a DC rectifier circuit such as rectifier 2 of FIG. 1 and those described in Imai (S. Imai et. al, "Efficiency and Harmonics Generation in Microwave to DC Conversion Circuits of Half-Wave and Full-Wave Rectifiers, "IEEE MTT-S International," May 2011, p 15-18, herein incorporated by reference in its entirety) and those described and supplied by Powercast Corporation of 566 Alpha Drive, Pittsburgh, Pa. 15238, USA. This will produce a direct current or voltage output to power a signal processor or other devices. The direct current output can also be switched to produce pulsed signals (e.g., outputs 4 of FIG. 1) from laser or light emitting diodes. In this embodiment, the device would transmit a photonic data signal through fiber optics or free space to avoid signal jamming.

The dimensions of the transmitter are determined from above simulations. In a planar configuration with a 0.08 T magnetic field and Vyo of 0.4×C the radius is about 11 mm. The spacing between the radioisotope emitting surface and the resonant cavity surface is preferably at least two times that radius to prevent the electrons from colliding with the cavities. Increasing the magnetic field strength or decreasing the initial velocity decreases the electron orbit radius and hence the spacing between the plates.

The length of the device 1 (in the direction of the magnetic field) is determined by the quantity and density of the radioisotope. The radioisotope can be deposited in a long trench or series of parallel trenches in the emitter surface. The depth and width of a trench is chosen so that the opening collimates the emission angle to about 40 degrees. For a transmitter requiring 100 mg of Sulfur-35 the radioisotope is formulated as a sulfur compound such as sodium sulfate. That compound has a density of 2.66 grams per cubic centimeter and contains 19 weight percent Sulfur-35. Hence, ten parallel trenches 0.5 centimeter long by 0.33 cm deep by 0.12 cm wide would be sufficient to contain and collimate the radioisotope. After assembly, the emitter surface and resonant cavity structure are preferably placed inside an evacuated, hermetically sealed enclosure.

Another embodiment of the device 1 has the beta radioisotope material fed through a tube in the trench on a continuous basis. The tube is constructed of an electron transparent material such as silicon carbide or a low density plastic such a polyethylene. This approach allows addition of new radioisotope to the device as the activity of the original radioisotope decreases over its half-life. Likewise a gaseous beta emitting radioisotope, such as K-85, could be circulated through the tube to utilize the beta emissions until the activity has significantly decreased. In a further embodiment, the device 1 may be mounted to or within, or otherwise incorporated with, a storage tank for monitoring radioisotope material within the tank, such as K-85. The output signal of the transmitter may then be monitored to detect changes in the material contained within the tank (for example the extent of decay of the radioisotope).

In another embodiment, the LC cavities are arranged in a semi-annular or annular configuration around the tube containing the beta emitter with the magnetic field oriented parallel to the axis of the tube.

In a preferred embodiment, the device 1, the resonant LC cavities are fabricated from metalized plastic. This construction method greatly reduces the device weight and expands its application to weight sensitive vehicles such as satellites. The plastic resonant cavity structure may be fabricated by 3D printing or conventional milling methods. Metalizing the plastic substrate with a copper or silver coating at a thickness greater than ten times the metal skin depth at the operating frequency is sufficient to provide the required inductance value for the resonant cavities.

The signal electronics (5) in FIG. 1 and other system components discussed above may each optionally include one or more computer processors and memory for retrieving, executing, and storing instructions and data according to the methods described herein. Each processor may be comprised of one or more components configured as a single unit. One or more components of each processor may be of the electronic variety defining digital circuitry, analog circuitry, or both. The operating logic of the described method can be embodied in signals transmitted over a network between the internal system components or between external components, in programming instructions, dedicated hardware, or a combination of these.

The use of the terms "a" and "an" and "the" and similar references in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

All publications and patent applications cited in this specification are herein incorporated by reference as if each individual publication or patent application were specifically and individually indicated to be incorporated by reference. Further, any theory, mechanism of operation, proof, or finding stated herein is meant to further enhance understanding of the present invention, and is not intended to limit the present invention in any way to such theory, mechanism of operation, proof, or finding. While the invention has been illustrated and described in detail in the drawings and foregoing description, the same is to be considered as illustrative and not restrictive in character, it being understood that only selected embodiments have been shown and described and that all equivalents, changes, and modifications that come within the spirit of the inventions as defined herein or by the following claims are desired to be protected.

The invention claimed is:

1. A method for providing an electromagnetic wave output signal, comprising:
   causing beta electrons from a radioisotope to interact with a magnetic field through a Lorenz force to produce propagating electrons with an angular velocity sufficient to induce electromagnetic currents in at least one resonant cavity to produce said output signal, wherein said propagating electrons propagate in a trajectory with an orbit radius, and wherein said at least one resonant cavity is spaced from said radioisotope a distance equal to at least two times said orbit radius.

2. The method of claim 1, wherein the magnetic field is produced by permanent magnets such that the magnetic field has a value between 0.01 and 4 Tesla.

3. The method of claim 1, wherein the beta emitting radioisotope is chosen from the group: P-33, P-32, S-35, Pm-147, Ir-194, Cs-134, Eu-155, Kr-85, and H-3.

4. The method of claim 1, wherein the radioisotope is located in at least one trench cut into a surface near the resonant cavity to collimate the electron emission angle.

5. The method of claim 1, wherein the radioisotope is placed within at least one tube fabricated from electron transparent material.

6. The method of claim 5, wherein the electron transparent material is chosen from the group: silicon nitride, amorphous silicon carbide, silicon oxide, titanium, a low density plastic, and polyethylene.

7. The method of claim 5, wherein the radioisotope source is fed in a continuous or semi-continuous manner through the tube.

8. The method of claim 1, wherein said at least one resonant cavity is fabricated from metalized plastic.

9. The method of claim 8, wherein said metallized plastic comprises a metal chosen from the group copper, silver and other highly conductive materials.

10. The method of claim 8, wherein said plastics are chosen from the group: high density polyethylene, ultrahigh molecular weight polyethylene, and polyimide.

11. The method of claim 1, further comprising: directing the output signal to a rectifier to be converted to direct current or voltage to power electronic devices.

12. The method of claim 1, further comprising: converting the output signal to direct current with a rectifier, and pulsing the direct current to drive laser or light emitting diodes.

13. The method of claim 1, wherein said electromagnetic currents are induced in a plurality of resonant cavities.

14. An apparatus, comprising:
   an electromagnetic wave transmitter, the transmitter comprising:
     a plurality of resonant cavities arranged linearly;
     a radioisotope material positioned to transmit beta electrons for inducing electromagnetic currents in said resonant cavities; and
     a magnetic field source producing a magnetic field;
     wherein said beta electrons interact with said magnetic field due to a Lorenz force and are propagated with an angular velocity sufficient to induce electromagnetic currents in said resonant cavities, said electromagnetic currents producing a corresponding electromagnetic output signal.

15. The apparatus of claim 14, wherein the magnetic field source comprises at least one permanent magnet and said magnet field has a value between 0.01 and 4 Tesla.

16. The apparatus of claim 14, wherein the radioisotope is chosen from the group consisting of: P-33, P-32, S-35, Pm-147, Ir-194, Cs-134, Eu-155, Kr-85, and H-3.

17. The apparatus of claim 14, wherein the radioisotope is located in at least one trench cut into a bottom member to collimate an emission angle of said beta electrons.

18. The apparatus of claim 14, wherein the radioisotope is placed within at least one tube fabricated from electron transparent materials chosen from the group: silicon nitride, amorphous silicon carbide, silicon oxide, titanium, and a low density plastic.

19. The apparatus of claim 18, wherein the radioisotope source is fed in a continuous or semi-continuous manner through the tube.

20. The apparatus of 18, further comprising a storage tank for storing the radioisotope, wherein the tube is connected to the tank to allow the radioisotope contained within the tank to circulate through the tube.

21. The apparatus of claim 14, wherein said resonant cavities are fabricated from metalized plastic.

22. The apparatus of claim 21, wherein said metalized plastic comprises a metal chosen from the group consisting of: copper, silver; and a highly conductive material.

23. The apparatus of claim 21, where said plastic is chosen from the group consisting of: high density polyethylene, ultrahigh molecular weight polyethylene, and polyimide.

24. The apparatus of claim 14, further comprising at least one rectifier configured to rectify and convert said electromagnetic output signal to direct current or voltage.

25. The apparatus of claim 14, wherein the direct current output is pulsed to drive laser or light emitting diodes thereby transmitting photonic data signals.

26. The apparatus of claim 14, wherein the magnetic field is substantially, homogeneous.

27. The apparatus of claim 14, wherein said beta electrons are propagated in a cycloid trajectory sequentially past said resonant cavities.

28. The apparatus of claim 14, wherein the electromagnetic output signal has a frequency in the S or Ka band.

29. The apparatus of claim 14, wherein:
said radioisotope is located in a trench in a first member having a first surface and said resonant cavities are defined in a second member having a second surface facing said first surface:
wherein said first surface extends generally parallel to said second surface and is spaced a distance from said second surface;
wherein said propagating electrons propagate in a trajectory with an orbit radius; and
wherein said distance is equal to at least two times said orbit radius.

30. An apparatus, comprising:
a tank suitable for storing a beta electron emitting radioisotope material; and
an electromagnetic wave transmitter operatively connected to the tank, the transmitter comprising:
at least one resonant cavity;
a bottom member separated from the at least one resonant cavity;
a tube connected to the tank, said tube allowing material stored in the tank to circulate through the tube, the tube passing through or mounted to the bottom member; and
a magnetic field source producing a magnetic field;
wherein beta electrons emitted from material when received in said tank interact with said magnetic field due to a Lorenz force and are propagated with an angular velocity sufficient to induce electromagnetic currents in said at least one resonant cavity, said electromagnetic currents producing a corresponding electromagnetic output signal.

31. The apparatus of claim 30, further comprising a beta electron emitting radioisotope material received within the tank.

* * * * *